United States Patent

Blalock et al.

[11] Patent Number: 6,056,850
[45] Date of Patent: May 2, 2000

[54] APPARATUS FOR IMPROVING THE PERFORMANCE OF A TEMPERATURE-SENSITIVE ETCH PROCESS

[75] Inventors: Guy T. Blalock; Bradley J. Howard, both of Boise, Id.

[73] Assignee: Micron Technology, Inc., Boise, Id.

[21] Appl. No.: 09/005,409

[22] Filed: Jan. 9, 1998

Related U.S. Application Data

[60] Continuation of application No. 08/735,225, Oct. 22, 1996, which is a division of application No. 08/679,295, Jul. 12, 1996, Pat. No. 5,711,851.

[51] Int. Cl.[7] .............................. C23C 16/00; H05H 1/00
[52] U.S. Cl. .................. 156/345; 118/723 E; 118/724
[58] Field of Search ................ 156/345; 118/723 E, 118/715, 723 I, 723 MN, 722

[56] References Cited

U.S. PATENT DOCUMENTS

| | | |
|---|---|---|
| 3,887,407 | 6/1975 | Ono et al. . |
| 4,115,184 | 9/1978 | Poulsen . |
| 4,424,621 | 1/1984 | Abbas et al. . |
| 4,500,563 | 2/1985 | Ellenberger et al. . |
| 4,502,914 | 3/1985 | Trumpp et al. . |
| 4,971,653 | 11/1990 | Powell et al. . |
| 5,002,794 | 3/1991 | Ratner et al. . |
| 5,167,748 | 12/1992 | Hall . |
| 5,213,659 | 5/1993 | Blalock et al. . |
| 5,286,344 | 2/1994 | Blalock et al. . |
| 5,290,381 | 3/1994 | Nozawa et al. . |
| 5,334,251 | 8/1994 | Nashimoto ............................ 156/345 |
| 5,346,585 | 9/1994 | Doan et al. . |
| 5,362,666 | 11/1994 | Dennison . |
| 5,407,531 | 4/1995 | Chiu et al. . |
| 5,436,172 | 7/1995 | Moslehi . |
| 5,446,825 | 8/1995 | Moslehi et al. . |
| 5,474,648 | 12/1995 | Patrick et al. ......................... 156/345 |
| 5,547,539 | 8/1996 | Arasawa et al. . |
| 5,548,470 | 8/1996 | Husain et al. . |
| 5,567,267 | 10/1996 | Kazama et al. . |
| 5,584,971 | 12/1996 | Komino . |

FOREIGN PATENT DOCUMENTS 406097119  4/1994  Japan ................................... 156/345

*Primary Examiner*—Shrive Beck
*Assistant Examiner*—Parviz Hassanzadeh
*Attorney, Agent, or Firm*—Killworth, Gottman, Hagan & Schaeff LLP

[57] ABSTRACT

The temperature of a dry etch process of a semiconductor substrate in a plasma etch chamber is controlled to maintain selectivity while also providing a high etch rate by introducing one or more cooling steps into the etch process. To maintain selectivity of the etch as well as a high rate of etch, the formation of plasma is terminated prior to exceeding a predetermined maximum temperature at at least one selected location in the chamber. The temperature at the selected location is reduced prior to the resumption of plasma flow and etching. The plasma etch is then continued, and may optionally be terminated again to permit cooling, as needed, until etching has been completed.

19 Claims, 2 Drawing Sheets

APPARATUS FOR IMPROVING THE PERFORMANCE OF A TEMPERATURE-SENSITIVE ETCH PROCESS

CROSS REFERENCE TO RELATED APPLICATIONS

This application is a continuation of U.S. Application Ser. No. 08/735,225, filed Oct. 22, 1996, which application is a division of U.S. Application Ser. No. 08/679,295, filed Jul. 12, 1996, now U.S. Pat. No. 5,711,851, issued Jan. 27, 1998.

BACKGROUND OF THE INVENTION

The present invention relates to temperature sensitive dry etch processes used in semiconductor fabrication and apparatuses for performing dry etches, and more particularly to controlling the temperature of such processes and such apparatuses to maintain selectivity while providing a high etch rate.

The manufacture of semiconductor devices, and particularly multilayer structures, involves, among other fabrication steps, the patterned etching of areas of the semiconductor surface which are not protected by a pattern of photoresist material. Such etching techniques use either liquid ("wet") etching compositions or gaseous "dry" etching compositions. For example, certain halogen-containing mineral acids such as HCl and HF are known to be active etchants for many of the materials found in semiconductors. When used as wet etchant compositions, these compositions will etch the semiconductor surface isotropically, i.e., in both vertical and lateral directions.

Etching of semiconductor layer materials may also be accomplished using, for example, halogen-containing compounds in the gas phase. Such techniques are broadly categorized as dry etching and include plasma etching, ion beam etching, and reactive ion etching. The use of gas plasma, in the form of gaseous ions, electrons, and neutrals formed from radio frequency discharge, as the etchant provides for substantially anisotropic etching (i.e., etching in the vertical direction only) of the semiconductor surface. Anisotropic etching techniques have become increasingly important as higher density (and thus smaller dimensions) multilayer semiconductors have been introduced.

Such small dimensions and tight tolerances in this industry have created problems which cannot be successfully addressed using photolithography techniques in combination with wet etching. Accordingly, anisotropic etching procedures, in which feature widths must be maintained within certain alignment tolerances, are used. One technique which has been developed along with anisotropic dry etching is the use of etch stop layers.

In an etch stop procedure, an etch stop layer of material is deposited atop an underlying structure. An outer layer, through which desired patterns will be formed, is then deposited over the etch stop layer. The etch stop layer is used to terminate the etching process through the outer layer once that layer has been completely removed in a desired pattern and to protect the underlying structure from the etchant.

Etch stop procedures are designed to have (1) a high outer layer etch rate which (2) etches anisotropically to produce substantially upright sidewalls through the outer layer, and (3) has a high selectivity so that the etchant preferentially etches the material of the outer layer, but not (or only very slowly) the etch stop layer. A preferred etch stop material in the art is silicon nitride because it has properties which are well known and is used widely in semiconductor fabrication. A typical outer layer to be etched comprises silicon dioxide.

One process for obtaining high selectivity in the etching procedure is taught in Blalock et al, U.S. Pat. No. 5,286,344, where a fluorinated etchant containing specific additives is used to form a gas plasma which etches silicon dioxide at a high selectivity with respect to an underlying silicon nitride layer. Other gas plasma etchants with high selectivity are also known.

One problem which has existed in the art for such selective oxide/nitride etches is that if the temperature of the substrate to be etched or the interior of the plasma etching apparatus is too high, the rate of oxide etch drops, and the etch may not be completed. That is, a portion of the insulating oxide layer may remain, preventing good electrical connections from being formed in later fabrication steps. Additionally, if the temperature in the plasma etching apparatus is too high, some of the etchant gas may polymerize and be deposited on the walls of the etched layer. The presence of polymer impedes the rate of etch and results in the formation of angled, not vertical, walls. The polymer may also interfere with completion of the etch through to the etch stop layer. Such overheating problems may occur where the outer layer to be etched is relatively thick, or where the etching process must be continued for a relatively long time period such as in a self-aligned contact etch, or where a high electrode temperature is used.

While some plasma etch apparatuses include a wafer cooling system to maintain the wafer at a constant temperature during the etching process, maintaining a constant wafer temperature does not address the overheating problems in the plasma generating apparatus. Accordingly, the need still exists in the art for a technique for improving the performance of a temperature-sensitive etch process.

SUMMARY OF THE INVENTION

The present invention meets that need by controlling the temperature of a dry etch process in a plasma etch chamber to maintain selectivity while also providing a high etch rate by introducing one or more cooling steps into the etch process. The process includes the steps of providing a semiconductor substrate having at least one layer of material thereon to be etched in a chamber and initiating plasma etching of one or more selected areas on the layer of material to be etched in the chamber. To maintain selectivity of the etch as well as a high rate of etch, the formation of plasma is terminated prior to exceeding a predetermined maximum temperature at at least one selected location in the chamber. For example, the location may be a wall of the chamber, any temperature-sensitive hardware within the chamber such as an electrode, or the semiconductor substrate. The temperature at the at least one selected location is then reduced prior to the resumption of plasma flow and etching. This temperature reduction may be accomplished by actively cooling the selected location or simply permitting that location to cool. The plasma etch is then continued. The etch may optionally be terminated again to permit cooling, as needed, until etching has been completed.

In a preferred embodiment of the invention, the layer of material to be etched comprises silicon dioxide which overlies a silicon nitride etch stop layer. In this preferred embodiment, the predetermined maximum temperature for the process is approximately 120° C. Above that temperature, the etch rate of the oxide becomes too low, and polymer formation on the walls of the etched silicon dioxide layer increases.

To insure that the predetermined temperature of the process is not exceeded, the temperature of at least one selected location in the chamber may be monitored. In a preferred embodiment, the temperature of the semiconductor substrate is monitored by a fiber optic probe positioned adjacent the back side of the substrate. A similar probe may also be utilized to monitor the temperature of the electrode and/or the chamber walls.

Generally, simply terminating the flow of plasma to the chamber and pausing for several minutes will cause the temperature to drop sufficiently that the etching process may then be resumed. Alternatively, the chamber may be actively cooled by flowing inert gas through it or by raising the gas pressure in the chamber to increase convective heat transfer from the semiconductor substrate, the electrode, and the walls in the chamber. The semiconductor substrate may be actively cooled by flowing inert gas over the backside thereof.

The present invention is also useful for commercial apparatuses which etch a series of semiconductor wafers in sequence under automated control. The process includes the steps of providing a first semiconductor substrate having at least one layer of material thereon to be etched in a chamber and initiating plasma etching of one or more selected areas on the layer of material to be etched in the chamber and continuing plasma etching thereof until the etch is completed. The first semiconductor substrate is removed and replaced with a succeeding semiconductor substrate to be etched. These steps are repeated until the series of semiconductor wafers has been processed. During this processing sequence, the formation of plasma in the chamber is terminated prior to exceeding a predetermined maximum temperature at at least one selected location in the chamber either during etching of the semiconductor substrate or during removal and replacement of the semiconductor substrate and the temperature at said at least one selected location is reduced prior to resumption of plasma etching.

Accordingly, it is a feature of the present invention to provide an apparatus for controlling the temperature of a dry etch process and a plasma etch chamber to maintain selectivity, while also providing a high etch rate by introducing one or more cooling steps into the etch process. This and other features and advantages of the present invention, will become apparent from the following detailed description, the accompanying drawings, and the appended claims.

DETAILED DESCRIPTION OF THE PREFERRED EMBODIMENTS

The present invention is useful in the practice of a number of different types of plasma etching procedures including gas plasma etching, ion beam etching, and reactive ion etching. For ease of explanation and understanding, reference will be made to a specific plasma etching system operated in a reactive ion etch mode. However, it will be apparent to those skilled in this art that the process and apparatus of the present invention may be modified as needed and used in a variety of dry etch systems.

Figure 1:
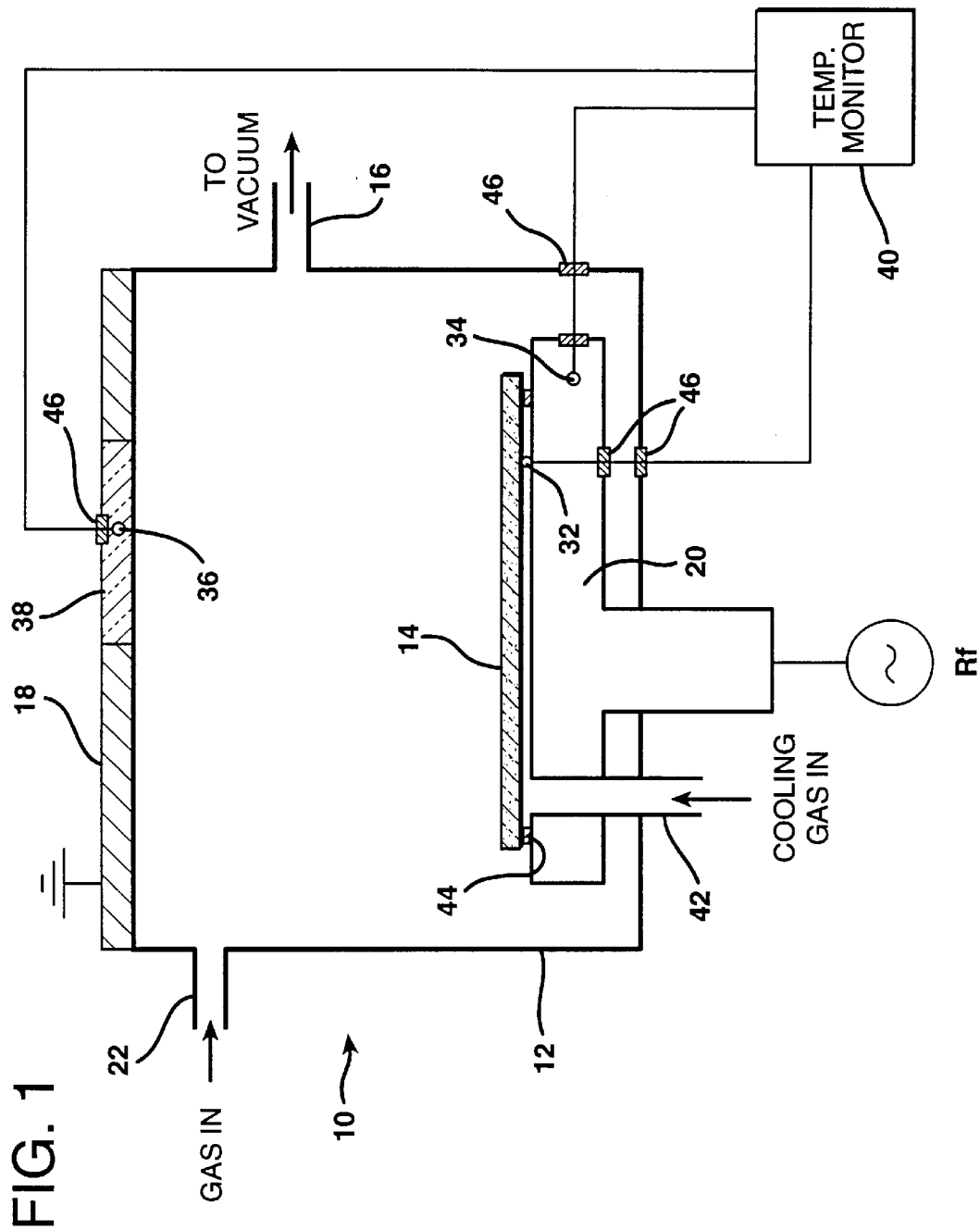
FIG. 1 is a schematic representation of a plasma etch chamber in accordance with the present invention.

Referring now to FIG. 1, there is shown a reactive ion etching system 10 which includes an etching chamber 12 in which one or more semiconductor wafer substrates 14 may be housed. For simplicity, only one wafer substrate has been shown. As is conventional, the etching process may be carried out at from atmospheric pressure down to about 1 mtorr. The chamber 12 is provided with a source of vacuum, shown schematically at 16. The vacuum source may be a turbo pump connected to a backing pump as is conventional in this art. Preferably, the cooldown process is carried out at as high a pressure (up to atmospheric) as can be sustained. Higher gas pressures in chamber 12 provide for more rapid cooling of the semiconductor substrate and internal walls of the chamber as convection of the gases provides more efficient heat transfer.

Chamber 12 includes an upper electrically grounded electrode 18 which forms the top wall of the chamber and a lower radio-frequency (RF) powered electrode 20. Substrate 14 is secured, typically by a clamp (not shown), to electrode 20 during the plasma etch process. Chamber 12 also contains an inlet 22 through which suitable feed gases and gas mixtures may be fed. For example, a typical fluorinated etchant may comprise $CHF_3$ or $CF_4$ gas along with a suitable carrier gas such as argon. Cooling in chamber 12 may be accomplished by increasing the pressure of gas in the chamber by feeding additional gas (either etchant gas or an inert gas) through inlet 22.

When RF energy is supplied to electrode 20, the gas fed into chamber 12 is converted to plasma. The plasma contains reactive neutral and ionic species which etch selected unprotected portions of the surface of substrate 14. A valve (not shown) may be supplied to the vacuum outlet 16 to control the pressure of the gas plasma in chamber 12.

Figure 2:
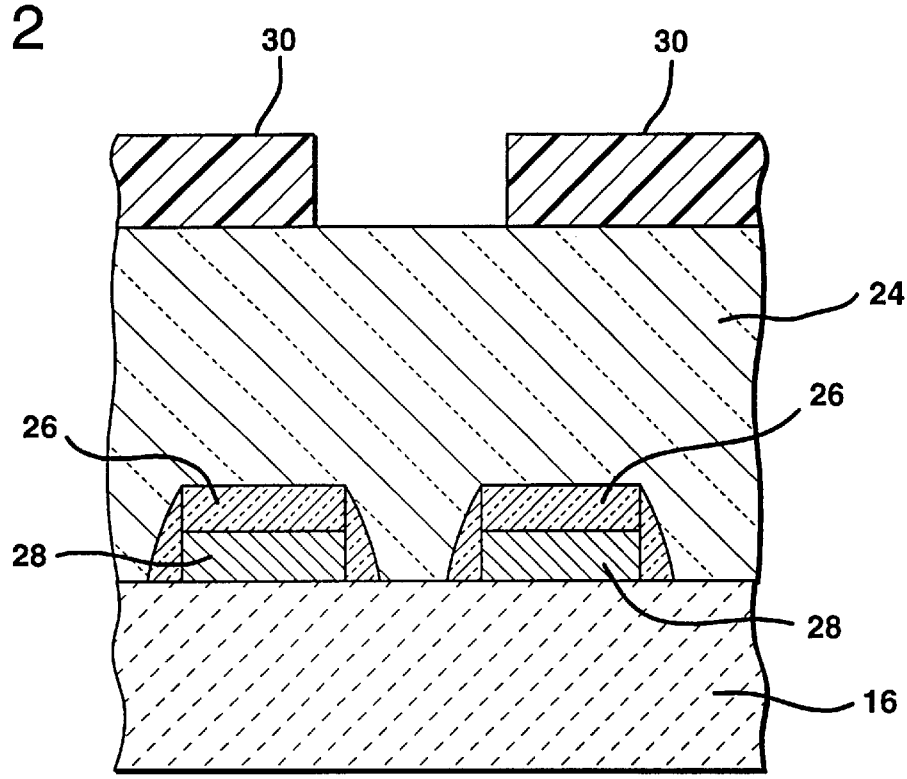
FIG. 2 is a side view, in cross-section, of an exemplary pictorial representation of a multilayer semiconductor substrate to be etched.

The process and apparatus of the present invention are applicable to any of a number of dry plasma etch procedures which need to be carried out in the course of the fabrication of a semiconductor device. As an example, and for explanatory purposes only, reference is made to FIGS. 2 and 3. There, a silicon semiconductor substrate 16 is depicted in which a silicon dioxide ($SiO_2$) layer 24 is to be plasma etched to form a self-aligned contact through to substrate 16. A silicon nitride ($Si_3N_4$) etch stop layer 26 has previously been deposited over polysilicon layers 28 to protect them. As shown, the silicon nitride etch stop layer extends over and conforms to the sides of the polysilicon layer beneath it. A pattern of photoresist 30 is masked onto the surface of the substrate to protect certain areas and to expose those areas where etching will occur.

Figure 3:
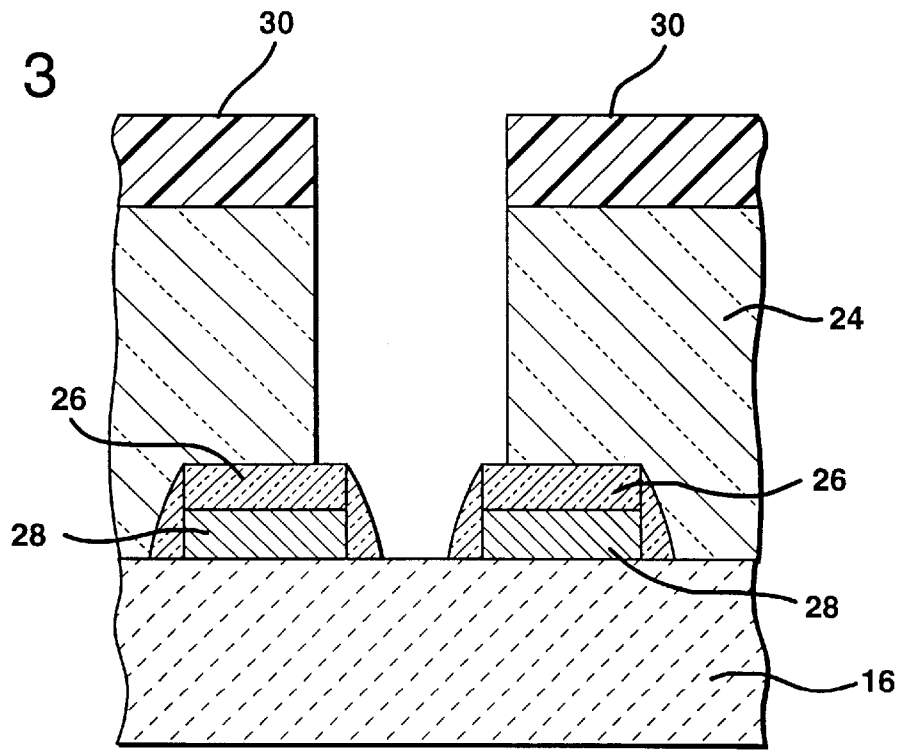
FIG. 3 is a side view, in cross-section, of the multilayer semiconductor substrate of FIG. 2 after etching the silicon dioxide outer layer to form a self-aligned contact.

In this example, a chemical etchant gas comprising at least one fluorinated gas such as $CHF_3$ and/or $CF_4$ in an argon carrier is supplied and converted to a plasma. The exposed silicon dioxide is selectively etched by the plasma at a relatively rapid rate and with high selectivity down to the etch stop layer 26. Due to the anisotropic etching nature of the gas plasma, the etching process provides for the formation of upright sidewalls in the etched silicon dioxide layer which have a substantially vertical profile as shown in FIG. 3.

Because of the distance which must be etched, the continued exposure of the substrate to gas plasma causes the temperature of the substrate to increase. However, many etches are temperature sensitive in that both the rate of etch as well as the selectivity of the etch will be affected by temperature. In the example of a silicon dioxide etch using a silicon nitride etch stop layer, it is desirable to have the substrate at a relatively high temperature (i.e., greater than approximately 50° C.) to provide high selectivity for the etch (even though a higher temperature decreases the rate of etch). Otherwise, if the temperature is too low, the gas plasma will also remove portions of the etch stop layer and possibly expose the underlying polysilicon layer.

Alternatively, if the temperature of the substrate increases beyond about 120° C., the etch rate of the plasma through the silicon dioxide drops, and the process may be terminated prior to the etch reaching the underlying silicon substrate (i.e., the etch stops in oxide). Additionally, if the temperature in the gas plasma chamber becomes too high, the etchant gas will tend to polymerize, forming polyfluorocarbons, and may be deposited on the sidewalls and base of the etched silicon dioxide layer. The presence of polymer over the silicon dioxide slows the rate of etch to an unacceptable rate.

The present invention eliminates these problems by controlling the temperature of the plasma etch process to maintain selectivity of the etch while also providing a high etch rate by introducing one or more cooling steps into the etch process. Prior to exceeding a predetermined maximum temperature in, for example, one of the walls of the chamber, any temperature-sensitive hardware in the chamber such as an electrode, or the semiconductor substrate, the formation of gas plasma is terminated. The chamber wall or walls, the electrode and/or the semiconductor substrate are then either actively cooled or permitted to cool prior to the resumption of plasma flow and etching.

Such cooling may be accomplished in a number of ways. In one embodiment, the temperature of the substrate, chamber, and electrodes may be determined empirically by running one or more test samples and observing the changes in temperature in the system. The process may then be programmed to terminate the flow of plasma at predetermined intervals either to permit cooling prior to the resumption of etching or to provide an active cooling step such as increasing the gas pressure in the chamber (using either more etchant gas or an inert gas) to increase convective heat transfer.

Alternatively, the temperatures of one or more of the substrate, chamber, and electrodes may be actively monitored using temperature monitoring device 40. This embodiment of the invention is shown schematically in FIG. 1. There, one or more temperature probes 32, 34, and 36 may be positioned in or adjacent to any of the substrate 14, RF electrode 20, or chamber 12 respectively. As shown, chamber 12 may have a viewing window 38 of a transparent material such as alumina into which the temperature probe may be positioned. In each instance, vacuum fittings 46 are provided to prevent any leakage from chamber 12.

The probes may be fiber optic devices such as those commercially available from Luxtron, Inc. Those probes include a phosphorescent material on the tip of the fiber optic which will transmit light back to a monitor as a function of the temperature which is sensed. Thus, if one or more of the substrate, chamber walls, or RF electrode is determined to be approaching a predetermined maximum temperature, the system may be programmed to terminate the production of gas plasma until such time as the affected device cools.

Alternatively, the fiber optic temperature probes may be associated with an active cooling system. One such cooling system is schematically depicted in FIG. 1. There, a wafer substrate cooling system is provided which includes a source of cooling gas which may be directed to the back side of substrate 14 as needed. A passage may be formed through RF electrode 20 to provide access to the semiconductor wafer. The wafer is mounted on an 0-ring seal 44 to provide a fluidtight passage. A cooling gas such as helium or argon may then be directed against the back side of the wafer to cool it as needed. It will be appreciated that similar active cooling systems may also be used to cool other parts of the chamber and/or electrodes.

Once the chamber, substrate, or electrode is cooled, the plasma etch is then continued, and may optionally be terminated again to permit further cooling, as needed, until etching has been completed. The process and apparatus of the present invention are able to control the temperature of the plasma etch to within predetermined limits. This assures that both the etch rate and selectivity of the etch remain high.

The process and apparatus of the present invention may also be adapted for use in a multiple wafer sequential processing system. Automated systems are commercially available in which multiple single semiconductor wafers may be etched in a gas plasma etching chamber in sequence and under the control of a microprocessor. Such a commercial apparatus is described in Blalock et al, U.S. Pat. No. 5,286,344, the disclosure of which is incorporated by reference. For such sequential operation, the apparatus of the present invention as shown in FIG. 1 operates in the manner discussed above. The flow of gas plasma may be terminated at predetermined intervals, or, alternatively, the temperature of the substrate, electrode, and chamber may be actively monitored and the plasma flow terminated as needed. If the substrate is removed from the chamber for cooling, it is preferred that the substrate remain under vacuum.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An apparatus for performing gas plasma etching of a semiconductor substrate comprising:

a) an enclosed chamber having upper, lower, and side walls for containing said semiconductor substrate, said chamber including a vacuum pump for evacuating said chamber;

b) a gas distributor in said chamber;

c) a spaced apart radio frequency electrode and grounded electrode in said chamber for generating gas plasma;

d) at least one temperature probe comprising a fiber optic probe positioned in said chamber for monitoring the temperature at a selected location in said chamber; and e) a controller communicating with said radio frequency electrode and said at least one temperature probe, said controller adapted to terminate the generation of gas plasma when a predetermined temperature is reached at said selected location.

2. An apparatus as claimed in claim 1 in which said controller is adapted to resume the generation of said gas plasma when said temperature of said selected location is below said predetermined temperature.

3. An apparatus as claimed in claim 1 in which said selected location is an upper, lower, or sidewall of said chamber.

4. An apparatus as claimed in claim 1 in which said selected location is said semiconductor substrate.

5. An apparatus as claimed in claim 1 in which said selected location is an electrode within said chamber.

6. An apparatus as claimed in claim 1 in which said temperature probe is positioned in one of said walls of said chamber.

7. An apparatus as claimed in claim 1 in which said temperature probe is positioned in or adjacent to said radio frequency electrode.

8. An apparatus as claimed in claim 1 in which said temperature probe is positioned adjacent to said semiconductor substrate.

9. An apparatus as claimed in claim 1 further including a device for holding said semiconductor substrate in said chamber, said semiconductor substrate including an underside, and a source of coolant supplied to said underside of said semiconductor substrate.

10. An apparatus for performing gas plasma etching of a semiconductor substrate comprising:
   a) an enclosed chamber having upper, lower, and side walls for containing said semiconductor substrate, said chamber including a vacuum pump for evacuating said chamber;
   b) a gas distributor in said chamber;
   c) a spaced apart radio frequency electrode and grounded electrode in said chamber for generating gas plasma;
   d) at least one temperature probe comprising a fiber oplic probe positioned in said chamber for monitoring the temperature at a selected location in said chamber;
   e) a source of coolant; and
   e) a controller communicating with said radio frequency electrode and said at least one temperature probe, said controller adapted to supply said coolant to reduce the temperature at said selected location in said chamber.

11. An apparatus as claimed in claim 10 in which said selected location is an upper, lower, or sidewall of said chamber.

12. An apparatus as claimed in claim 10 in which said selected location is said semiconductor substrate.

13. An apparatus as claimed in claim 10 in which said selected location is an electrode within said chamber.

14. An apparatus as claimed in claim 10 in which said temperature probe is positioned in one of said walls of said chamber.

15. An apparatus as claimed in claim 10 in which said temperature probe is positioned in or adjacent to said radio frequency electrode.

16. An apparatus as claimed in claim 10 in which said temperature probe is positioned adjacent to said semiconductor substrate.

17. An apparatus as claimed in claim 10 further including a device for holding said semiconductor substrate in said chamber, said semiconductor substrate including an underside, and said source of coolant supplied to said underside of said semiconductor substrate.

18. An apparatus for performing gas plasma etching of a semiconductor substrate comprising:
   a) an enclosed chamber having upper, lower, and side walls for containing said semiconductor substrate, said chamber including a vacuum pump for evacuating said chamber;
   b) a gas distributor in said chamber;
   c) a spaced apart radio frequency electrode and grounded electrode in said chamber for generating gas plasma; and
   d) a controller communicating with said radio frequency electrode, said controller programmed to terminate the generation of gas plasma at predetermined intervals to permit said chamber walls to cool prior to the resumption of etching.

19. An apparatus for performing gas plasma etching of a semiconductor substrate comprising:
   a) an enclosed chamber having upper, lower, and side walls for containing said semiconductor substrate, said chamber including a vacuum pump for evacuating said chamber;
   b) a gas distributor in said chamber;
   c) a spaced apart radio frequency electrode and grounded electrode in said chamber for generating gas plasma; and
   d) a controller communicating with said radio frequency electrode, said controller programmed to increase the flow of gas to said chamber at predetermined intervals to cool said walls of said chamber prior to the resumption of etching.

* * * * *

UNITED STATES PATENT AND TRADEMARK OFFICE
CERTIFICATE OF CORRECTION

PATENT NO.    : 6,056,850
DATED         : May 2, 2000
INVENTOR(S)   : Blalock et al.

It is certified that error appears in the above-identified patent and that said Letters Patent is hereby corrected as shown below:

<u>Column 7,</u>
Line 23, "comprising a fiber oplic" should read -- comprising a fiber optic --.
Line 26, "and e) a controller" should read -- and f) a controller --.

Signed and Sealed this

Thirty-first Day of July, 2001

*Attest:*

*Attesting Officer*

NICHOLAS P. GODICI
*Acting Director of the United States Patent and Trademark Office*